United States Patent
Shin et al.

(10) Patent No.: US 7,643,976 B2
(45) Date of Patent: Jan. 5, 2010

(54) METHOD AND SYSTEM FOR IDENTIFYING LENS ABERRATION SENSITIVE PATTERNS IN AN INTEGRATED CIRCUIT CHIP

(75) Inventors: Jaw-Jung Shin, Hsin-Chu (TW); King-Chang Shu, Taipei (TW); Jan-Wen You, Jhongli (TW); Tsai-Sheng Gau, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 622 days.

(21) Appl. No.: 11/421,618

(22) Filed: Jun. 1, 2006

(65) Prior Publication Data

US 2007/0203680 A1    Aug. 30, 2007

Related U.S. Application Data

(60) Provisional application No. 60/777,909, filed on Feb. 28, 2006.

(51) Int. Cl.
   *G06F 9/455*    (2006.01)

(52) U.S. Cl. ............... 703/13; 716/4; 716/21; 382/145

(58) Field of Classification Search ............ 703/14, 703/13; 716/4, 19, 21, 6; 351/176; 430/5, 430/30; 382/144
See application file for complete search history.

(56) References Cited

U.S. PATENT DOCUMENTS

| | | | |
|---|---|---|---|
| 5,472,814 A | 12/1995 | Lin | |
| 6,632,592 B1 | 10/2003 | Mimotogi | |
| 6,646,729 B2 | 11/2003 | van der Laan et al. | |
| 6,654,107 B1 | 11/2003 | Watanabe et al. | |
| 2003/0088847 A1* | 5/2003 | Chang et al. | 716/19 |
| 2003/0103189 A1* | 6/2003 | Neureuther et al. | 351/176 |
| 2003/0199124 A1 | 10/2003 | Koizumi et al. | |
| 2003/0208728 A1* | 11/2003 | Pierrat | 716/4 |
| 2004/0076891 A1 | 4/2004 | Pierrat | |
| 2004/0142251 A1 | 7/2004 | Hsu et al. | |
| 2004/0197674 A1* | 10/2004 | Bailey et al. | 430/5 |
| 2005/0010878 A1* | 1/2005 | Blatchford et al. | 716/4 |
| 2005/0202328 A1* | 9/2005 | Smith et al. | 430/30 |
| 2005/0273753 A1* | 12/2005 | Sezginer | 716/21 |
| 2006/0010409 A1* | 1/2006 | Tamaki et al. | 716/6 |
| 2006/0039595 A1* | 2/2006 | Adel et al. | 382/144 |
| 2006/0199087 A1* | 9/2006 | Lucas et al. | 430/30 |
| 2006/0248497 A1* | 11/2006 | Huang et al. | 716/21 |
| 2006/0277520 A1* | 12/2006 | Gennari | 716/21 |

FOREIGN PATENT DOCUMENTS

| | | |
|---|---|---|
| EP | 1626310 A1 | 2/2006 |
| WO | 2005/073807 A1 | 8/2005 |

* cited by examiner

*Primary Examiner*—Paul L Rodriguez
*Assistant Examiner*—Kandasamy Thangavelu
(74) *Attorney, Agent, or Firm*—Haynes and Boone, LLP (57) ABSTRACT

Disclosed is a method and a system for identifying lens aberration sensitive patterns in an integrated circuit chip. A first simulation of a layout is performed to simulate a contour without lens aberration. A second simulation is performed of the layout to simulate a contour with lens aberration. A difference of critical dimension is determined between the contours with and without lens aberration, and at least one lens aberration sensitive pattern is selected from a plurality of layouts based on the difference in critical dimension.

21 Claims, 8 Drawing Sheets

METHOD AND SYSTEM FOR IDENTIFYING LENS ABERRATION SENSITIVE PATTERNS IN AN INTEGRATED CIRCUIT CHIP

CROSS-REFERENCE

This application claims priority from U.S. Provisional Patent Application Ser. No. 60/777,909 filed on Feb. 28, 2006, entitled "Method And System For Identifying Lens Aberration Sensitive Patterns In An Integrated Circuit Chip."

BACKGROUND

The present disclosure relates in general to integrated circuit chip fabrication, and more particularly, to a system and method to identify lens aberration patterns in an integrated circuit chip.

In current integrated circuit chip fabrication, a set of test patterns are often used to evaluate lens aberrations. Lens aberrations are deviations from the ideal lens behavior that results from design, fabrication or usage flaws. Typically, an optical proximity correction (OPC) model is used to correct a single layout and a simulation is performed on the corrected layout. The result of the simulation is compared with a designed layout. The difference in the critical dimensions (CDs) between the layouts represents one or more critical dimension errors. Although the detected CD errors are intended to indicate lens aberrations, they may also be due, in part, to inaccuracies of the OPC model. In addition, the set of test patterns used in CD detection may not accurately represent the real layout in a chip and the evaluation often underestimates the impact of lens aberration on CD variations of the actual layouts in a chip.

Therefore, a need exists for a method and system for identifying lens aberration sensitive patterns in an integrated circuit chip, such that the impact of a lens aberration can be isolated and the real layout in a chip can be represented.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

For the purposes of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, and this does not by itself indicate a requirement that features of one embodiment apply to another embodiment, even if they share the same reference number.

Aspects of the present disclosure provide a method and system for identifying lens aberration sensitive patterns in an integrated circuit chip. In an illustrative embodiment, two simulations are performed to simulate the contour of the same layout. A first simulation simulates the layout without lens aberration. A second simulation simulates the layout with a lens aberration. A determination of a critical dimension difference is made between the results of the two simulations and the original layout. Based on the critical dimension difference, patterns having the highest sensitivity to the lens aberration are selected from a full chip layout.

Figure 1:
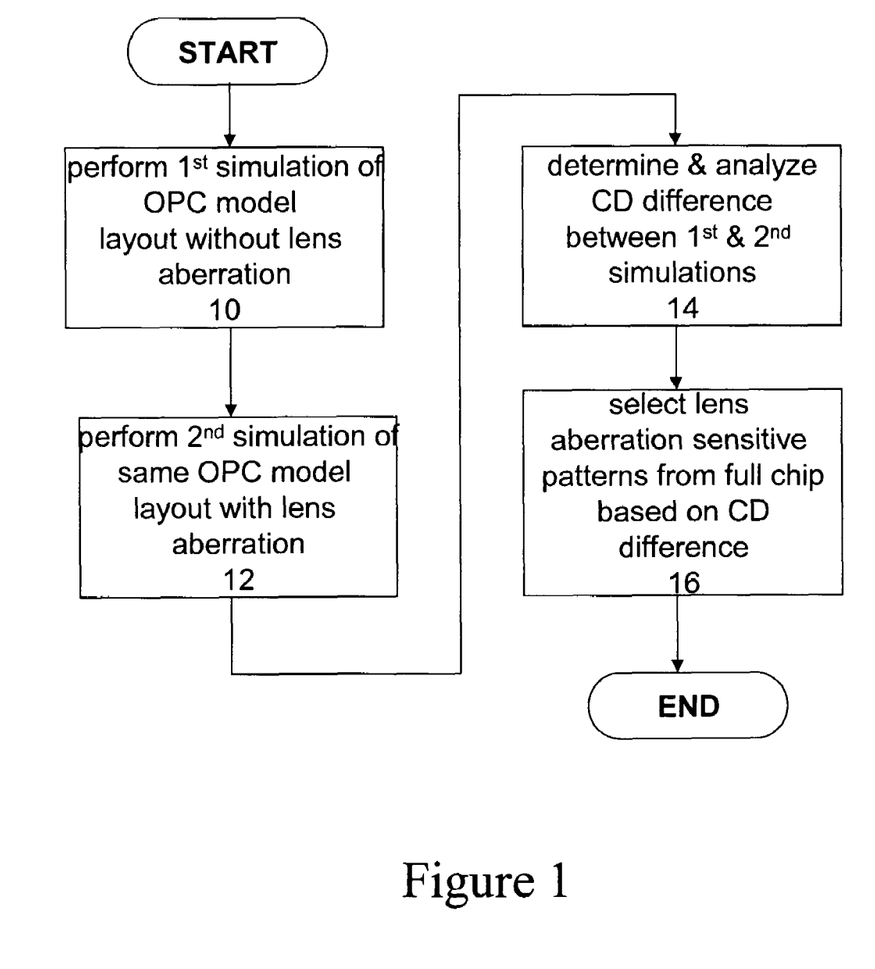
FIG. 1 is a flow diagram of an exemplary process for identifying lens aberration sensitive patterns.

Referring to FIG. 1, a flow diagram of an exemplary process for identifying lens aberration sensitive patterns is depicted. The process begins at step 10 when a first simulation of a layout corrected by OPC is performed. The first simulation simulates the contour of the layout without lens aberration. At step 12, a second simulation is performed on the same OPC model layout. The second simulation simulates the contour of the layout with lens aberration. At step 14, a difference in critical dimension is determined between the simulated contours and the CD difference is analyzed. Based on the CD difference, at step 16, lens aberration sensitive patterns are selected from a full chip layout. Thus, the process terminates.

Figure 2A:
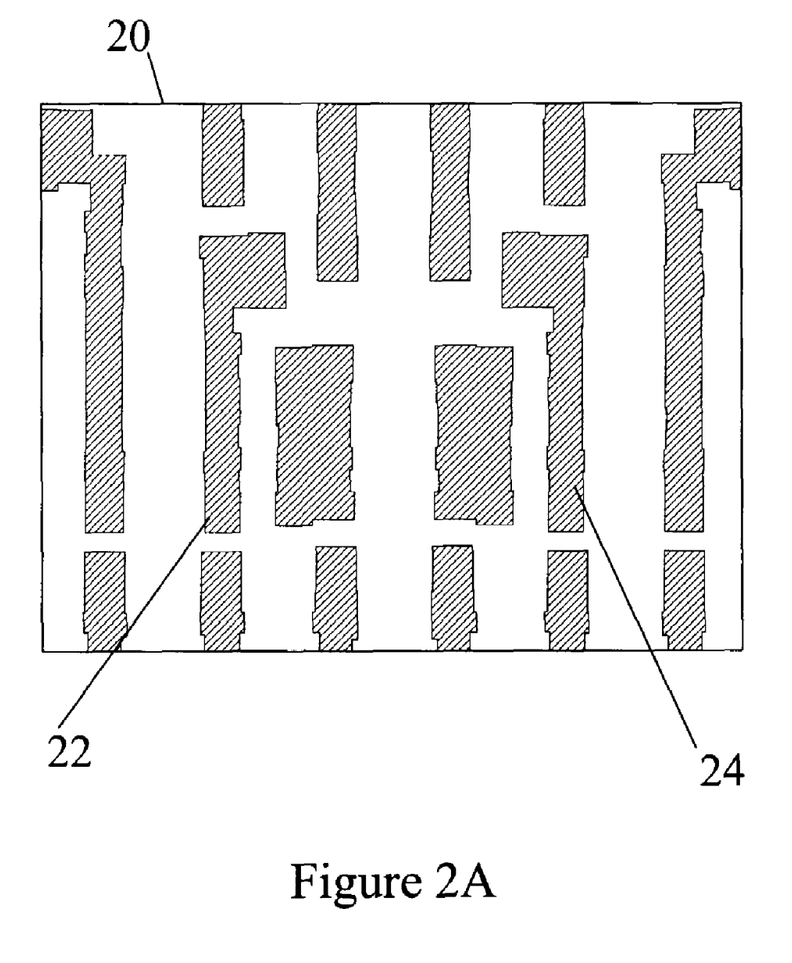
FIG. 2A is a diagram illustrating an exemplary OPC model layout.

Referring to FIG. 2A, a diagram illustrating an exemplary OPC model layout is depicted. An OPC model layout 20 represents a regular line array pattern comprising a most left line (L-Line) 22 and a most right line (R-Line) 24. A first simulation is performed to simulate the contour of layout 20 without lens aberration. A second simulation is then performed to simulate the contour of layout 20 with lens aberration. In this example, a comma aberration (Z7) of 0.05λ is applied to the projection lens. The results of the first and second simulations of layout 20 are shown in FIG. 2B.

Figure 2B:
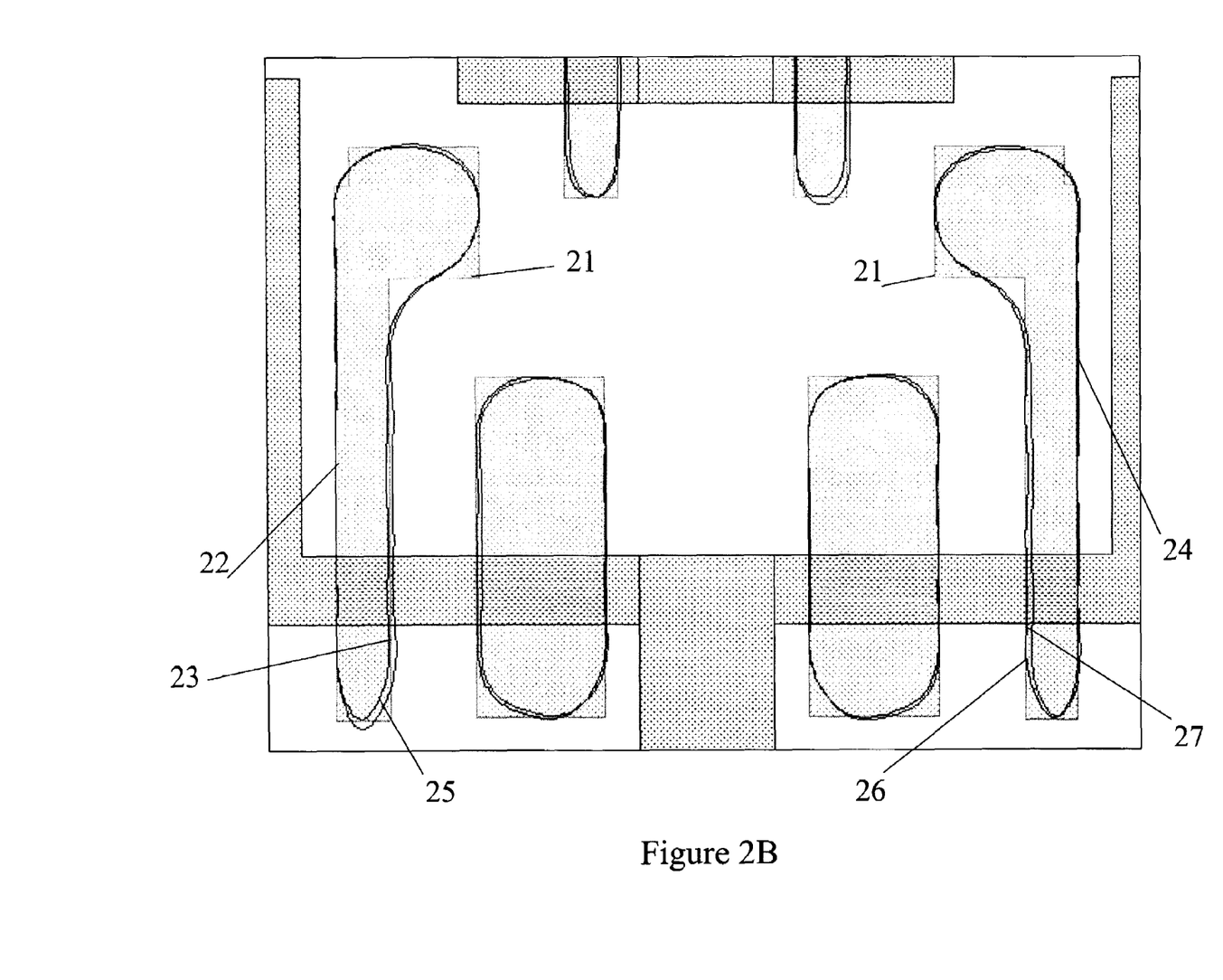
FIG. 2B is a diagram illustrating exemplary first and second contour simulations of the OPC model layout in FIG. 2A.

Referring to FIG. 2B, contour 23 is generated after the first simulation of most left line 22 without lens aberration. Contour 25 is generated after the second simulation of most left line 22 with a 0.05λ comma aberration. Similarly, contour 26 is generated after the first simulation of most right line 24 without lens aberration. Contour 27 is generated after the second simulation of most right line 24 with a 0.05λ comma aberration. Contours 23 and 26 simulated without lens aberration are very close to the original layout 21. However, contours 25 and 27 simulated with lens aberration have larger deviations from the original layout 21 than contours 23 and 26 due to the effects of comma aberration.

Based on the results of the first and second simulations, a difference in critical dimension is determined between the simulated contours. In this example, a CD difference of +9 to +10 nm is determined for most left line 22 and a CD difference of −6 to −7 nm is determined for most right line 24 due to the application of comma aberration.

Figure 3A:
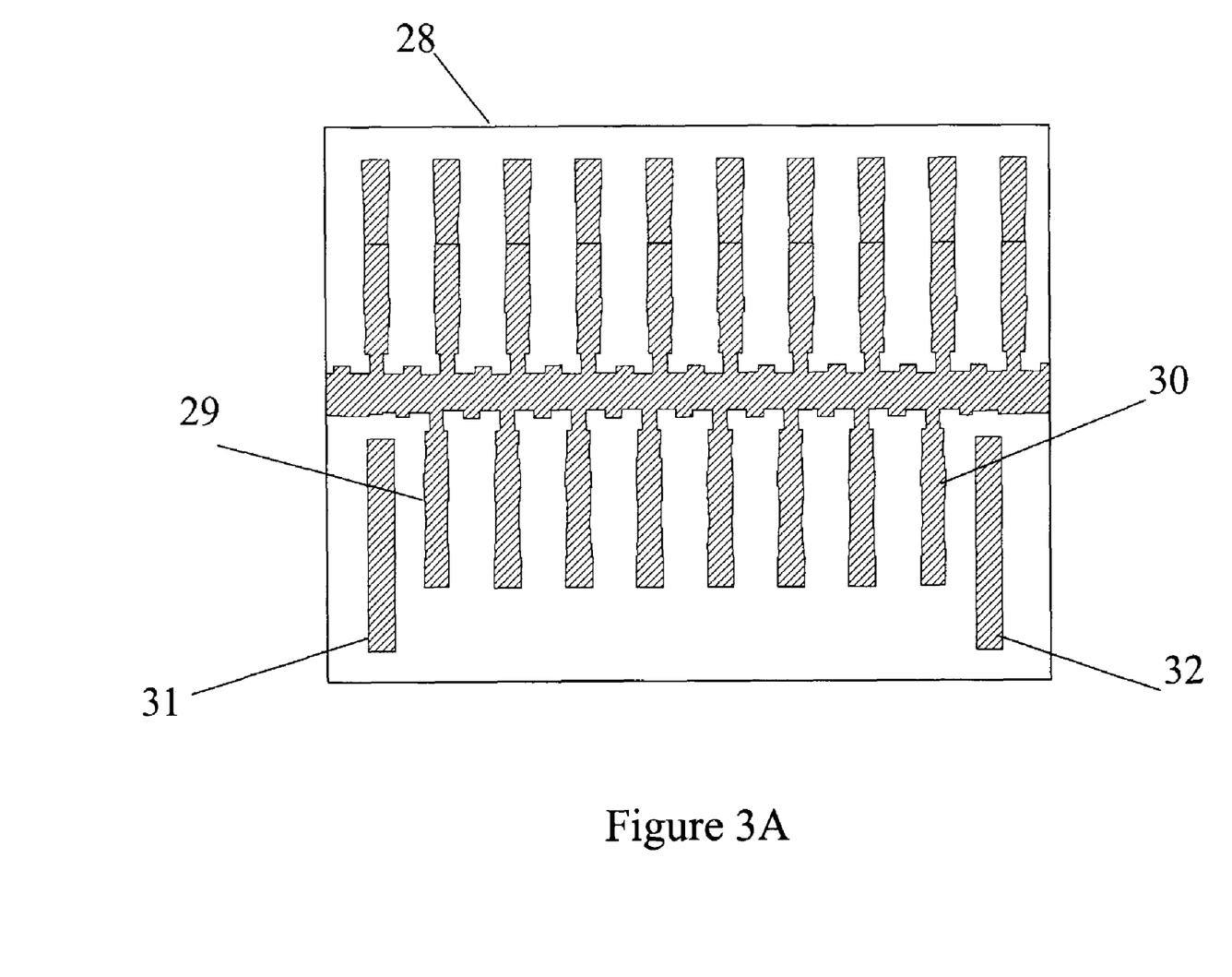
FIG. 3A is a diagram illustrating another exemplary OPC model layout.

Referring to FIG. 3A, a diagram illustrating another exemplary OPC model layout is depicted. In this example, an OPC model layout 28 comprises a left dense line (L-Dense) 29, a right dense line (R-Dense) 30, a left full size scattering bar (L-FSSB) 31, and a right full size scattering bar (R-FSSB) 32. A first and second simulations are performed to simulate the contour of OPC model layout 28 with and without lens aberration. The results of the first and second simulations are shown in FIG. 3B.

Figure 3B:
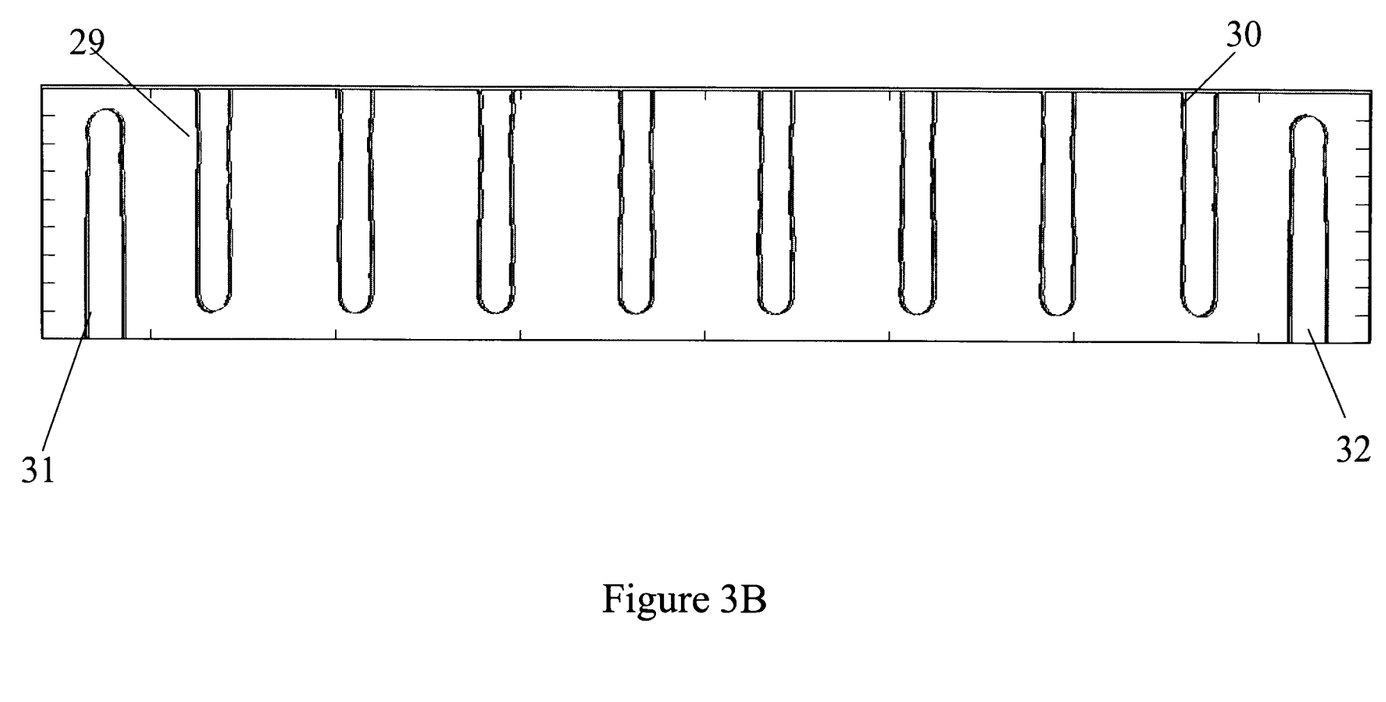
FIG. 3B is a diagram illustrating exemplary first and second contour simulations of the OPC model layout in FIG. 3A.

Referring to FIG. 3B, the contours simulated with and without lens aberration are very close to each other. The difference in critical dimension between the simulated contours is not as large as the difference in critical dimension shown in FIG. 2B. This means that layout 28 is less sensitive to lens aberration than layout 20. Based on the CD differences, patterns having the highest sensitivity to lens aberration are selected from a full chip layout as the most lens aberration sensitive patterns. Since larger lens aberration induces a larger CD difference, CD difference is a good indicator of sensitivity to lens aberration.

Figure 4:
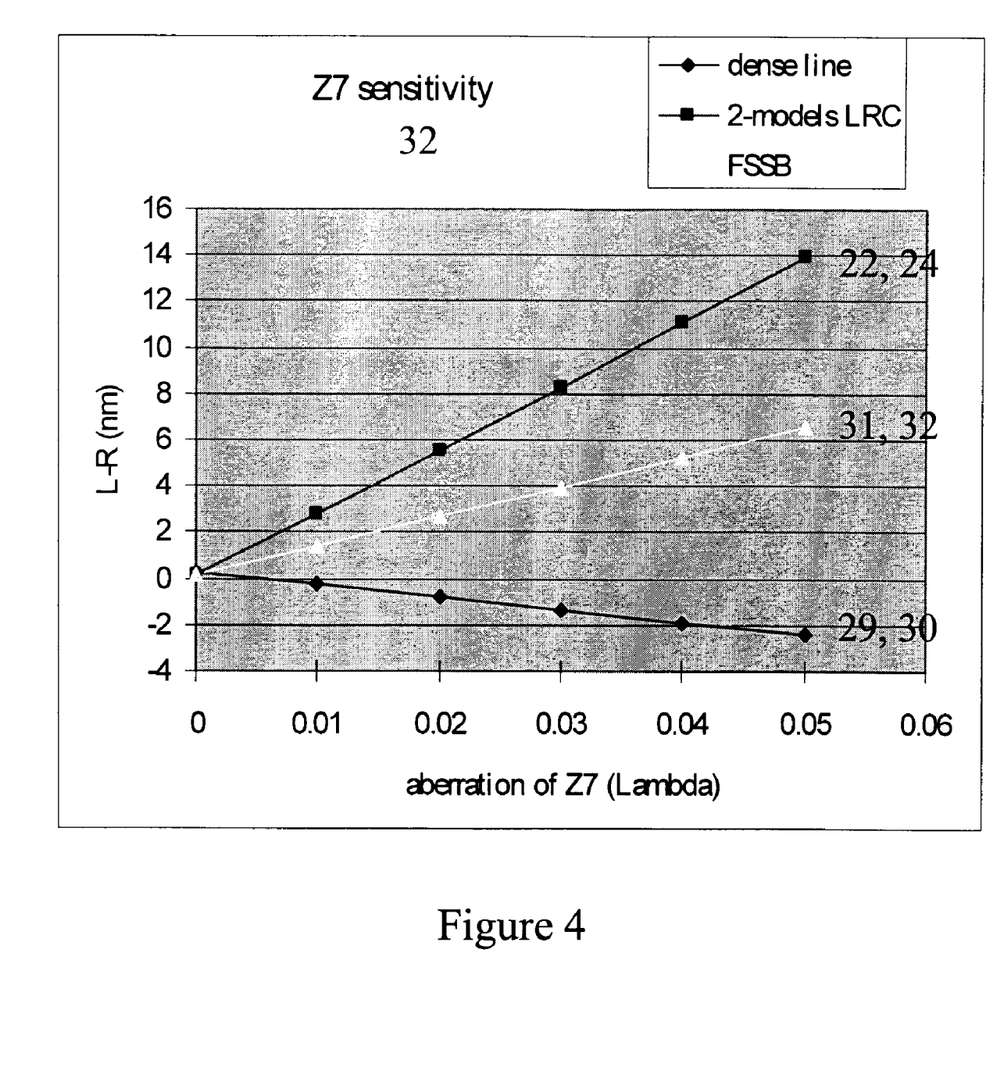
FIG. 4 is a graph illustrating CD differences between left line and right line (L-R) in layouts 20 and 28.

Referring to FIG. 4, a graph illustrating CD differences between left line and right line (L-R) in layouts 20 and 28 is depicted. The X-axis of graph 32 represents the wavelength λ applied for lens aberration. The Y-axis of graph 32 represents the CD difference in nm. The CD differences illustrated in this example include CD difference of 2-models LRC, which is the CD difference of most left line (L-Line) 22 and most right line (R-Line) 24 in layout 20; CD difference of dense line, which is the CD difference of L-Dense 29 and R-Dense 30 in layout 28; and the CD difference of FSSB, which is the CD difference of L-FSSB 31 and R-FSSB 32 in layout 28.

Based on the CD differences, the sensitivities of left line and right line (L-R) to lens aberration may be determined by dividing the CD difference by the comma aberration. As shown in graph 32, the sensitivity of 2-models LRC to lens aberration is 276 nm/λ. The sensitivity of dense line to lens aberration is −54 nm/λ. The sensitivity of FSSB to lens aberration is 128 nm/λ. Since the sensitivities of 2-models LRC is twice as much as the sensitivity of dense line, layout 20 comprising most left line (L-Line) 22 and most right line (R-Line) 24 is selected as the most lens aberration sensitive pattern.

Figure 5A:
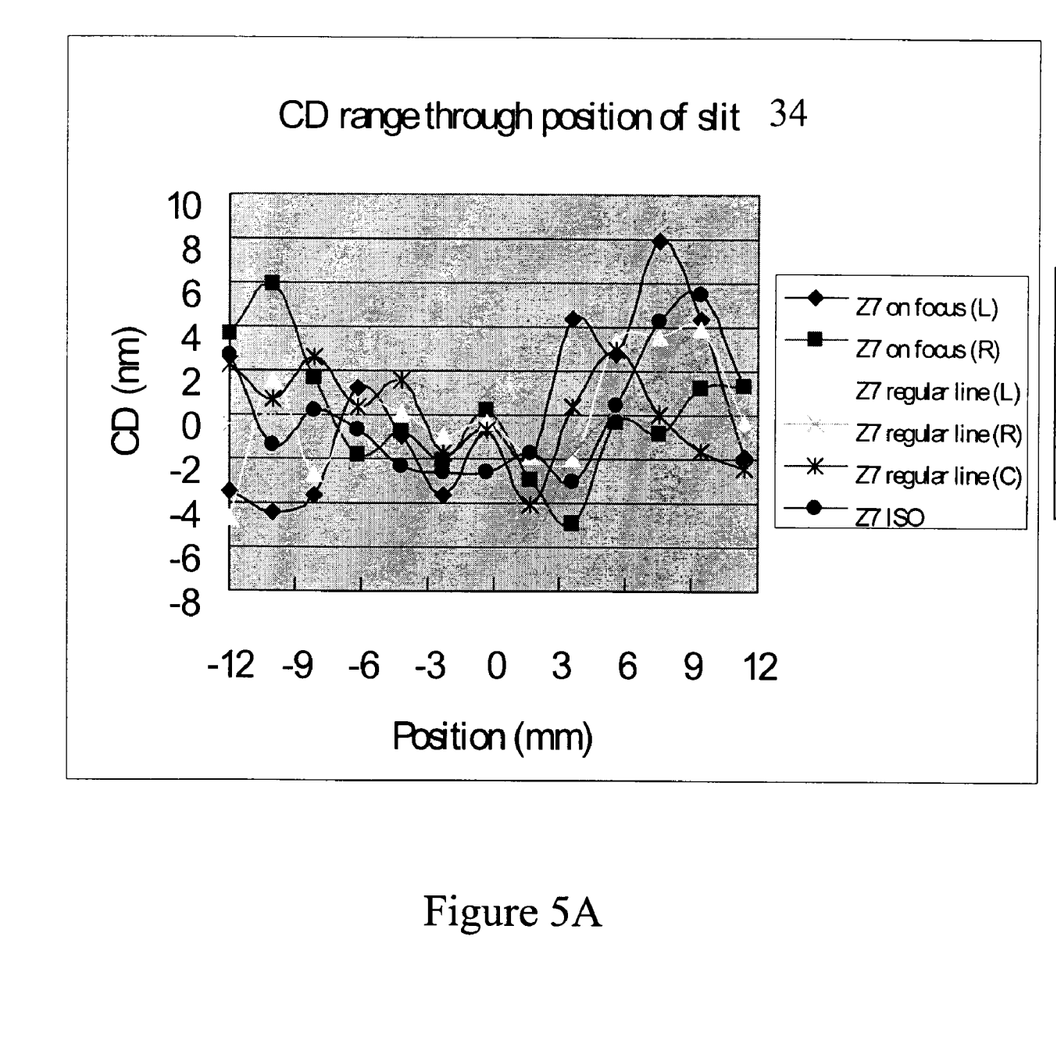
FIG. 5A is a graph illustrating the CD differences of individual line through different positions of a slit.

In addition to the above, the CD ranges obtained for different patterns in a full chip layout at different position of the slit also indicate how sensitive the patterns are to lens aberration. Referring to FIG. 5A, a graph illustrating the CD differences of individual line through different positions of a slit is depicted. The Y-axis of graph 34 represents the critical dimensions in nm. The X-axis of graph 34 represents the position of the slit in mm.

Figure 5B:
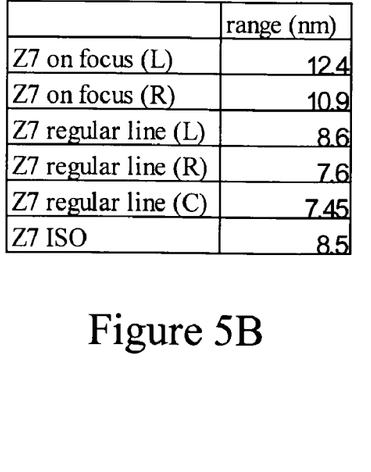
FIG. 5B is a diagram illustrating CD ranges of the individual line in FIG. 5A.

In graph 34, the CD difference of left line and right line (L-R) in layout 20 are shown as Z7 on focus. The CD difference of left line, right line, and center line of layout 28 are shown as Z7 on regular line. The CD difference of an isolated line are shown as Z7 on ISO. The CD ranges of the individual line are illustrated in FIG. 5B. In this example, Z7 on focus has a larger CD range than Z7 on regular line and Z7 on ISO. This means that layout 20 is the most lens aberration sensitive pattern because of the larger CD difference and the impact of lens aberration to CD uniformity is the highest in the whole chip.

Figure 6:
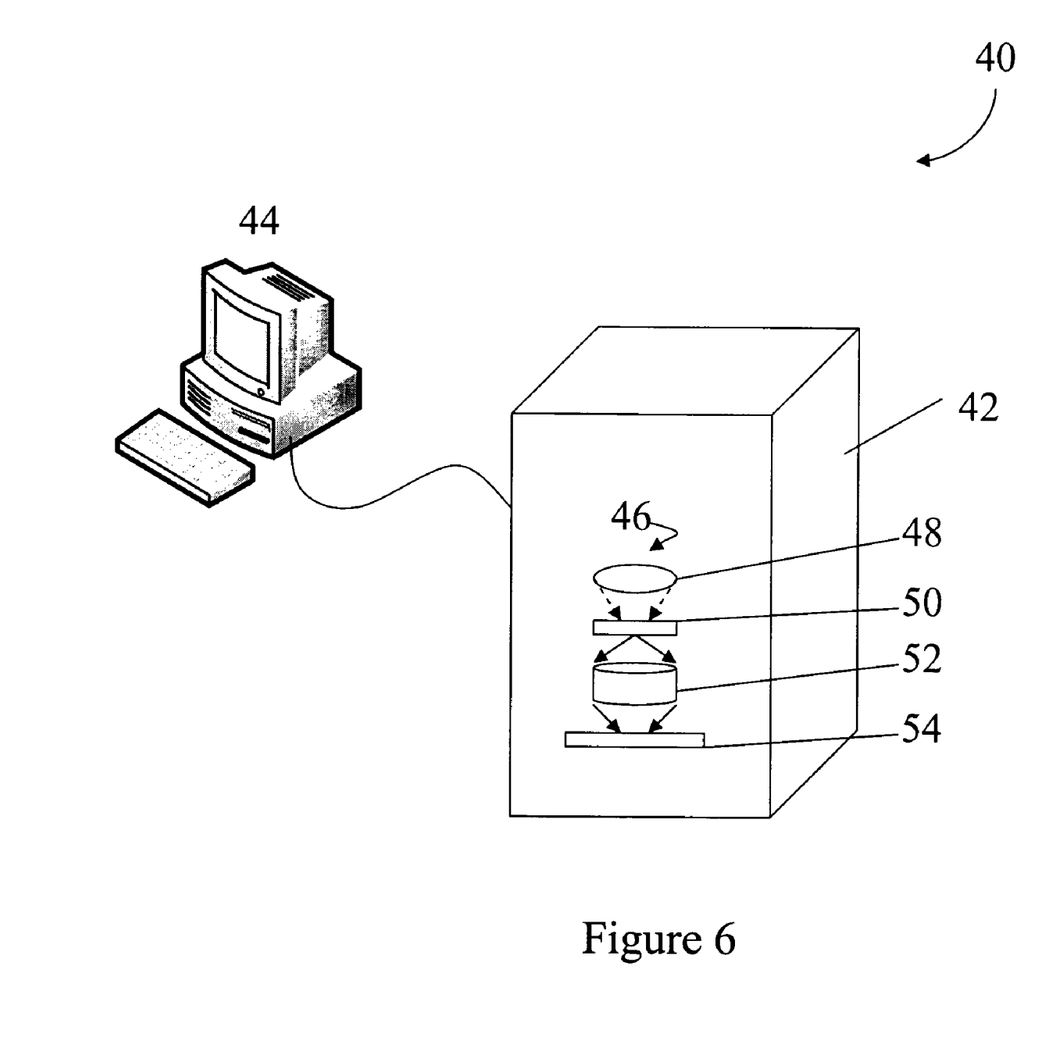
FIG. 6 is a diagram illustrating a system for identifying lens aberration sensitive patterns in an integrated circuit chip.

Referring to FIG. 6, a diagram illustrating a system for identifying lens aberration sensitive patterns in an integrated circuit chip is depicted. Lens aberration sensitive pattern identification system 40 comprises an optical photolithography equipment 42 for wafer exposure. Photolithography equipment 42 comprises an exposure system 46. In an illustrative embodiment, exposure system 46 comprises an illuminating source 48, a mask 50, a projection lens 52, and a processing wafer 54. Aspects of the present disclosure may be implemented within exposure system 46, which is controlled by an operator data processing system 44. In one embodiment, aspects of the present invention may be implemented as OPC software within photolithography equipment 40 to identify lens aberration sensitive patterns from a full chip. Alternatively, aspects of the present invention may be implemented as part of the software of the operator data processing system 44.

In summary, aspects of the present disclosure provides a method and system for identifying lens aberration sensitive patterns in an integrated circuit chip. The identified patterns may be used to evaluate lens performance. Using the identified patterns, lens aberration may be adjusted to minimize future CD difference. In addition, the identified patterns may be modified to reduce the impact of lens aberration on CD uniformity. Furthermore, the impact of lens aberration alone may be characterized in a full chip. As a result, the overall quality of the exposure system may be improved.

In addition to lens aberration, the aspects of the present disclosure may be extended to simulate OPC model layouts onfocus and defocus to identify patterns that are focus sensitive. In an illustrative embodiment, the first simulation may simulate a contour of a layout onfocus. The second simulation may simulate a contour of the same layout defocus. Focus sensitive patterns may be identified from the CD difference between the two simulated contours. In addition, other parameters of the exposure system 46 may be used to simulate the contours, for example, exposure energy. The first simulation may simulate a contour of a layout with a nominal energy. The second simulation may simulate a contour of the same layout with an energy deviated from nominal energy. In this way, patterns that are most sensitive to a particular parameter of the exposure system may be identified without the need for comparisons between different exposure systems.

It is to be understood that the following disclosure provides different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

What is claimed is:

1. A method of identifying lens aberration sensitive patterns in an integrated circuit chip, the method comprising:
   providing an exposure system;
   communicably coupling the exposure system to an operator data processing system configured to operate the exposure system, wherein the operator data processing system comprises a computer-readable medium, the medium having stored thereon a sequence of executable instructions;
   identifying lens aberration sensitive patterns in the chip by executing instructions for:

performing a first simulation of a layout to simulate a contour without lens aberration;

performing a second simulation of the layout to simulate a contour with lens aberration;

determining a difference of critical dimension between the contour with lens aberration and the contour without lens aberration; and selecting at least one lens aberration sensitive pattern from a plurality of layouts based on the difference in critical dimension, wherein selecting at least one lens aberration sensitive pattern from a plurality of layouts based on the difference in critical dimension includes determining a critical dimension range for the layout through different positions of a slit based on the difference of critical dimension.

2. The method of claim 1, wherein the layout is an original layout corrected by optical proximity correction.

3. The method of claim 1, wherein the lens aberration is a 0.05 λ comma aberration.

4. The method of claim 1, wherein selecting at least one lens aberration sensitive pattern from a plurality of layouts based on the difference in critical dimension farther comprises:

comparing the difference in critical dimension with a difference in critical dimension of another layout in the plurality of layouts; and selecting a layout from the plurality of layouts having a largest difference in critical dimension.

5. The method of claim 1, wherein selecting at least one lens aberration sensitive pattern from a plurality of layouts based on the difference in critical dimension farther comprises:

determining a sensitivity to lens aberration for the layout based on the difference of critical dimension;

comparing the sensitivity to lens aberration for the layout with a sensitivity to lens aberration of another layout in the plurality of layouts; and selecting a layout from the plurality of layouts having a highest sensitivity to lens aberration.

6. The method of claim 1, wherein selecting at least one lens aberration sensitive pattern from a plurality of layouts based on the difference in critical dimension further comprises:

comparing the critical dimension range for the layout with a critical dimension range of another layout in the plurality of layouts; and selecting a layout from the plurality of layouts having a highest critical dimension range.

7. The method of claim 1, further comprising:
evaluating performance of a lens based on the at least one lens aberration sensitive pattern.

8. The method of claim 1, further comprising:
modifying the at least one lens aberration pattern to minimize the difference in critical dimension.

9. A system for identifying lens aberration sensitive patterns in an integrated circuit chip, the system comprising:

means for performing a first simulation of a layout to simulate a contour without lens aberration;

means for performing a second simulation of the layout to simulate a contour with lens aberration;

means for determining a difference of critical dimension between the contour with lens aberration and the contour without lens aberration; and means for selecting a plurality of lens aberration sensitive patterns from a plurality of layouts based on the difference in critical dimension, wherein means for selecting a plurality of lens aberration sensitive patterns from a plurality of layouts based on the difference in critical dimension includes means for selecting a layout from the plurality of layouts having a largest difference in critical dimension.

10. The system of claim 9, wherein means for selecting a plurality of lens aberration sensitive patterns from a plurality of layouts based on the difference in critical dimension farther comprises:

means for comparing the difference in critical dimension with a difference in critical dimension of another layout in the plurality of layouts; and means for selecting a layout from a plurality of layouts having a largest difference in critical dimension.

11. The system of claim 9, wherein means for selecting a plurality of lens aberration sensitive patterns from a plurality of layouts based on the difference in critical dimension farther comprises:

means for determining a sensitivity to lens aberration for the layout based on the difference of critical dimension;

means for comparing the sensitivity to lens aberration for the layout with a sensitivity to lens aberration of another layout in the plurality of layouts; and means for selecting a layout from the plurality of layouts having a highest sensitivity to lens aberration.

12. The system of claim 9, wherein means for selecting a plurality of lens aberration sensitive patterns from a plurality of layouts based on the difference in critical dimension further comprises:

means for determining a critical dimension range for the layout through different positions of a slit based on the difference of critical dimension;

means for comparing the critical dimension range for the layout with a critical dimension range of another layout in the plurality of layouts; and means for selecting a layout from the plurality of layouts having a highest critical dimension range.

13. The system of claim 9, further comprising:
means for evaluating performance of a lens based on the at least one lens aberration sensitive pattern.

14. The system of claim 9, further comprising:
means for modifying the at least one lens aberration pattern to minimize the difference in critical dimension.

15. A system for identifying lens aberration sensitive patterns in an integrated circuit chip, the system comprising:

an optical proximity correction (OPC) system, wherein the OPC system includes a computer-readable medium, the medium having stored thereon a sequence of executable instructions which, when executed by a processor, causes the processor to identify lens aberration sensitive patterns;

a first simulator for simulating a contour of a layout without lens aberration;

a second simulator for simulating a contour of the layout with lens aberration;

a comparator for comparing the contour with lens aberration and the contour without lens aberration; and a mechanism for selecting at least one lens aberration sensitive pattern from a plurality of layouts based on the difference in critical dimension, wherein the mechanism for selecting at least one lens aberration sensitive pattern from a plurality of layouts based on the difference in critical dimension includes a mechanism for determining a critical dimension range for the layout through different positions of a slit based on the difference of critical dimension.

16. The system of claim 15, wherein the mechanism for selecting at least one lens aberration sensitive pattern is configured to select a layout from the plurality of layouts having a largest difference in critical dimension.

17. The system of claim 15, wherein the mechanism for selecting at least one lens aberration sensitive pattern comprises:
a mechanism for determining a sensitivity to lens aberration for the layout based on the difference of critical dimension;
a comparator for comparing the sensitivity to lens aberration for the layout with sensitivity to lens aberration of another layout in the plurality of layouts; and
a mechanism for selecting a layout from the plurality of layouts having a highest sensitivity to lens aberration.

18. The system of claim 15, wherein the mechanism for selecting at least one lens aberration sensitive pattern further comprises:
a comparator for comparing the critical dimension range for the layout with a critical dimension range of another layout in the plurality of layouts; and
a mechanism for selecting a layout from the plurality of layouts having a highest critical dimension range.

19. The system of claim 15, further comprising:
an evaluator for evaluating performance of a lens based on the at least one lens aberration sensitive pattern.

20. The system of claim 15, further comprising:
a mechanism for modifying the at least one lens aberration pattern to minimize the difference in critical dimension.

21. A method for identifying parameter sensitive patterns in an integrated circuit chip, the method comprising:
providing an exposure system;
communicably coupling the exposure system to an operator data processing system configured to operate the exposure system, wherein the operator data processing system comprises a computer-readable medium, the medium having stored thereon a sequence of executable instructions;
identifying parameter sensitive patterns in the chip by executing instructions for:
performing a first simulation of a layout to simulate a contour with a nominal value of the parameter;
performing a second simulation of the layout to simulate a contour with a value deviated from the nominal value of the parameter;
determining a difference of critical dimension between the contour with the nominal value and the contour with the value deviated from the nominal value; and
selecting at least one sensitive pattern from a plurality of layouts based on the difference in critical dimension, wherein selecting at least one sensitive pattern from the plurality of layouts based on the difference in critical dimension includes selecting a layout from the plurality of layouts having a highest critical dimension range.

* * * * *